United States Patent
Kim

(10) Patent No.: US 7,206,213 B2
(45) Date of Patent: Apr. 17, 2007

(54) SEMICONDUCTOR MEMORY DEVICE HAVING REPEATERS LOCATED AT THE GLOBAL INPUT/OUTPUT LINE

(75) Inventor: Mi Young Kim, Yongin-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 936 days.

(21) Appl. No.: 10/329,631

(22) Filed: Dec. 26, 2002

(65) Prior Publication Data

US 2004/0047404 A1 Mar. 11, 2004

(30) Foreign Application Priority Data

Sep. 10, 2002 (KR) .................. 10-2002-0054495

(51) Int. Cl.
*G11C 5/06* (2006.01)
*G11C 7/00* (2006.01)

(52) U.S. Cl. .................. 365/63; 365/189.05; 365/194

(58) Field of Classification Search .................. 365/63, 365/230.03, 194, 189.05
See application file for complete search history.

(56) References Cited

U.S. PATENT DOCUMENTS 6,134,179 A * 10/2000 Ooishi .................. 365/233
6,292,427 B1 * 9/2001 Roy .................. 365/230.03

* cited by examiner

*Primary Examiner*—Son Dinh
(74) *Attorney, Agent, or Firm*—Marshall, Gerstein & Borun LLP

(57) ABSTRACT

A semiconductor memory device includes a repeater located at a global input/output (GIO) line. The repeater buffers and transmits data between a data pad and a plurality of banks. The semiconductor memory device also includes a repeater control unit adapted to control the operation of the repeater in response to a read/write command associated with one of the plurality of banks. When a read or write operation is performed for the banks located farthest from the data pads, the repeater on the GIO line buffers the GIO signal, and thereby reduces the load of the GIO line, decreases the delay of the GIO signal, and improves the slope of the GIO signal. As a result, the semiconductor memory device is useful during high speed operations.

17 Claims, 9 Drawing Sheets

SEMICONDUCTOR MEMORY DEVICE HAVING REPEATERS LOCATED AT THE GLOBAL INPUT/OUTPUT LINE

BACKGROUND

1. Technical Field

A semiconductor memory device is disclosed. More specifically, a semiconductor memory device that improves the slope of a signal by reducing the delay of the signal is disclosed. This is achieved by decreasing the load at the global input/output line through the use of repeaters located at the global input/output line.

2. Description of the Related Art

In operation, a semiconductor memory device writes data to a cell, i.e., a data storage space, and reads data from the cell. FIG. 1 is an exemplary schematic diagram that depicts data input/output (IO) lines in a conventional DRAM having four memory banks. Each bank BK0, BK1, BK2, and BK3 includes a row control unit X_CTRL adapted to enable a word line WL, and a column select unit Y_CTRL adapted to enable a column select signal YI in order to designate a cell in the enabled word line WL. The data input/output (10) line is used to read and write data from and to a designated cell, which is determined by enabling the word line WL and the column select signal YI. The IO line includes a segment IO (SIO) line, a local 10 (LIO) line, and a global 10 (GIO) line depending on its position.

In operation, data associated with the cell bit line selected by the column select signal YI are applied to the SIO line. The data applied to the SIO line are applied to the LIO line shared by the SIO lines of cell segment blocks, and then transmitted to the input/output sense amps (IOSA) associated with each bank. In turn, the data sensed by the IOSA are applied to the GIO line. The GIO line is a shared line of memory banks that can be driven by the four banks BK0, BK1, BK2, and BK3.

To perform a read operation, an output driver outputs data via the GIO line to desired data pads DQ0, DQ1, . . . , DQn−1. In the DRAM, when data from the banks BK2 and BK3, which are located farther from the data pads DQ0, DQ1, . . . , DQn−1 than banks BK0 and BK1, are outputted to the data pads DQ0, DQ1, . . . , DQn−1, a delay time is substantially increased due to the long line length of the GIO line.

The increased capacity of the DRAM results in increased chip area. In turn, an increase of the chip area results in an increase in the length of the GIO line. As a result, the increased time delay due to the increased length of the GIO line restricts high speed operations. In addition, when line load is increased, the slope of the GIO signal deteriorates.

SUMMARY

Repeaters are located at a middle portion of the GIO line and function as buffers to decrease the load at the GIO line. Accordingly, the delay time of the GIO signal is reduced, and the slope of the GIO signal is improved.

A semiconductor memory device may include a repeater located at a GIO line that is shared among a plurality of banks. The repeater is adapted to buffer and transmit data between data pads and specific banks via the GIO line. The semiconductor memory device may further include a repeater control unit adapted to control the operation of the repeater in response to a read/write command associated with a specific bank.

DETAILED DESCRIPTION

Figure 1:
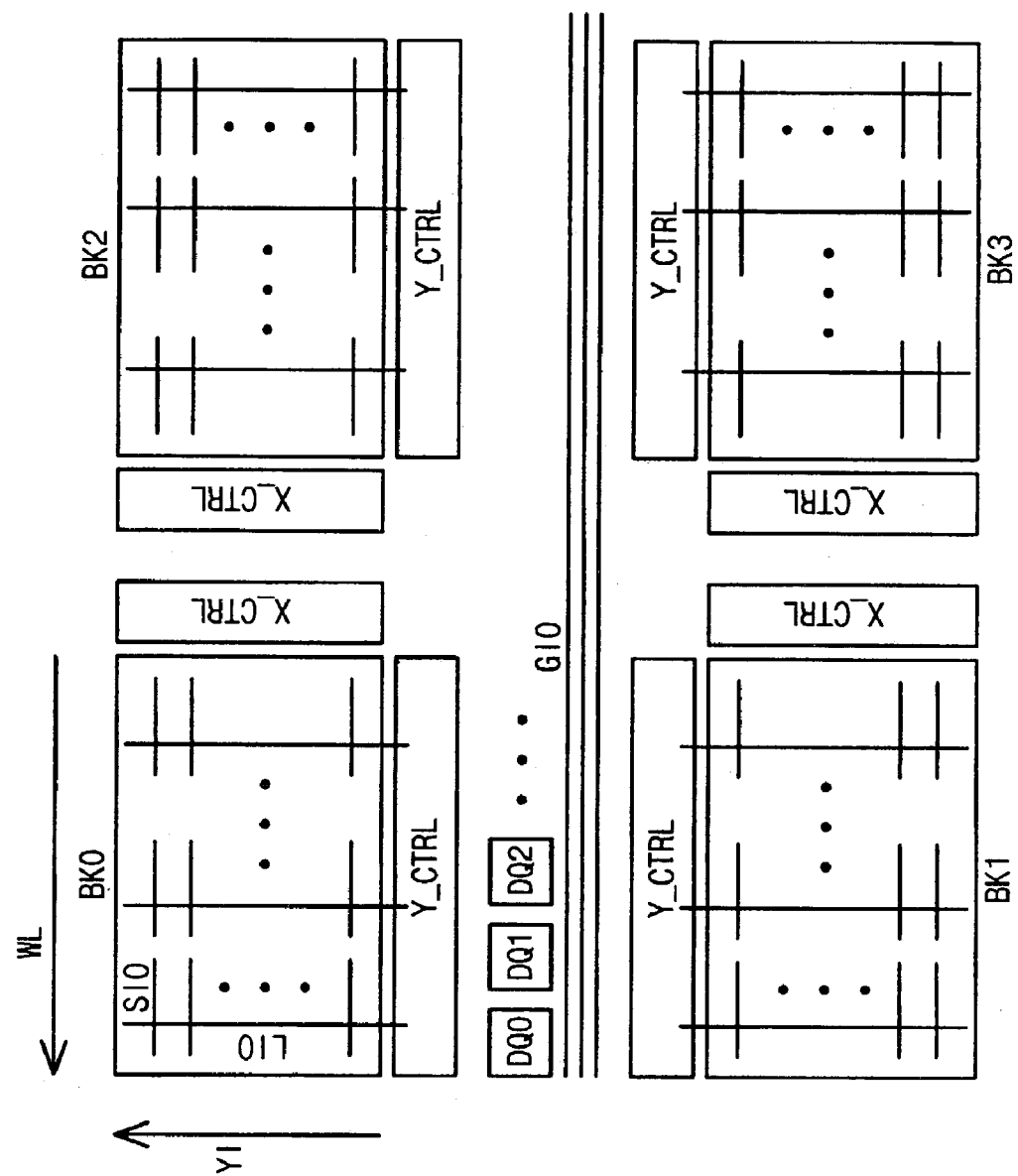
FIG. 1 is an exemplary schematic diagram that depicts data I/O lines in a conventional DRAM having four banks.
Figure 2:
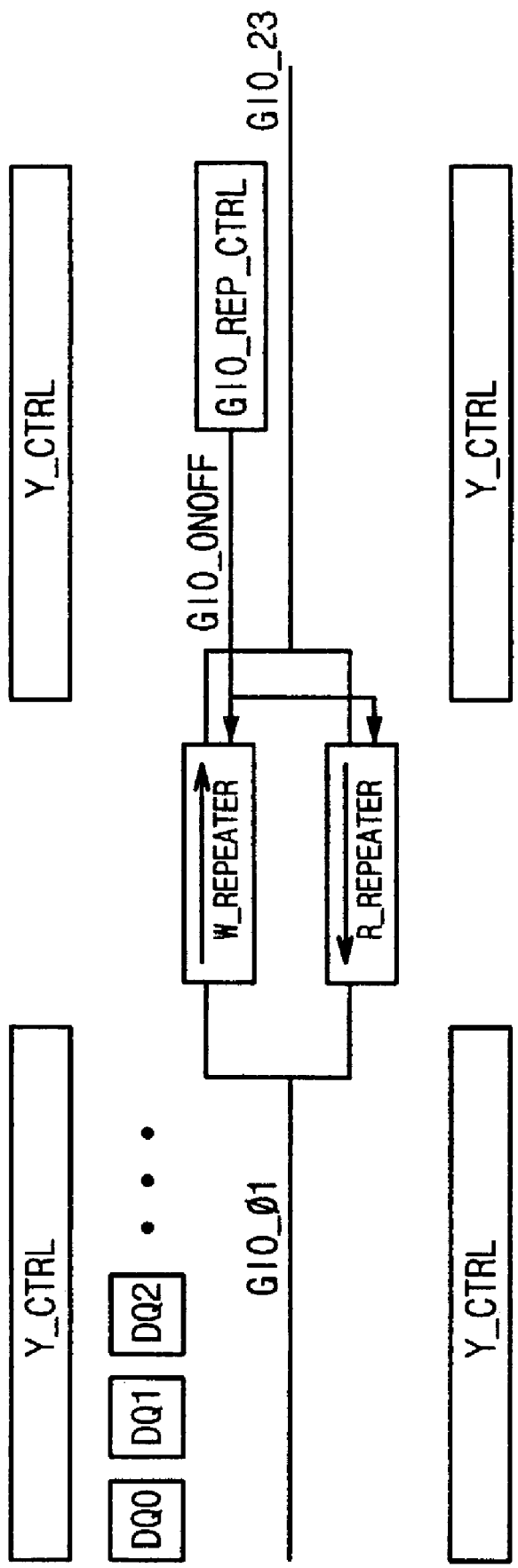
FIG. 2 is an exemplary schematic diagram that depicts a semiconductor memory device in which repeaters are located at a GIO line.

FIG. 2 is an exemplary schematic diagram that depicts the semiconductor memory device having repeaters R_REPEATER and W_REPEATER located at a center portion of a GIO line. The GIO line is commonly driven by four banks BK0, BK1, BK2, and BK3. As a result, it is nearly impossible to use a buffer composed of inverters on the GIO line directly. Therefore, the semiconductor memory device includes repeaters R_REPEATER and W_REPEATER in the read and write directions, respectively, that are located at a specific position in the semiconductor memory device. Preferably, the repeaters R_REPEATER and W_REPEATER are located at the center portion of the GIO line. The semiconductor memory device also includes a repeater control unit GIO_REP_CTRL that generates a control signal GIO_ONOFF to control the operation of the repeaters R_REPEATER and W_REPEATER.

As shown in FIG. 2, the portion of the GIO line that is located adjacent to the data pads DQ0, DQ1, . . . , DQn−1 is referred to as the GIO_01 line, and the portion of the GIO line that is located farther away from the data pads DQ0, DQ1, . . . , DQn−1 is referred to as the GIO_23 line. During a read operation of the DRAM, data from the LIO lines of each bank are transmitted to the GIO line and outputted to a desired data pad DQ0, DQ1, . . . , DQn−1. The repeater R_REPEATER is not in operation during a read operation for the banks BK0 and BK1 connected to the GIO_01 line. However, the repeater W_REPEATER is in operation during a read operation for the banks BK0 and BK1 connected to the GIO_01 line. The repeater R_REPEATER is in operation only when the banks BK2 and BK3 connected to the GIO_23 line are selected. In this manner, the signal of the GIO_23 line may be buffered, transmitted to the GIO_01 line, and outputted to a desired data pad.

During a write operation of the DRAM, data that are outputted to a desired data pad DQ0, DQ1, . . . , DQn−1 may be applied to the LIO line of the specific bank via the GIO line. Therefore, the repeater R_REPEATER is not in operation, but the repeater W_REPEATER is in operation. In other words, the repeater R_REPEATER and the repeater W_REPEATER are not in operation at the same time.

As described above, the repeater control unit GIO_REP_CTRL controls the repeaters R REPEATER and W_REPEATER to buffer the GIO signal without requiring that the repeaters R_REPEATER and W_REPEATER be in operation at the same time during the read and write operations.

Figure 3:
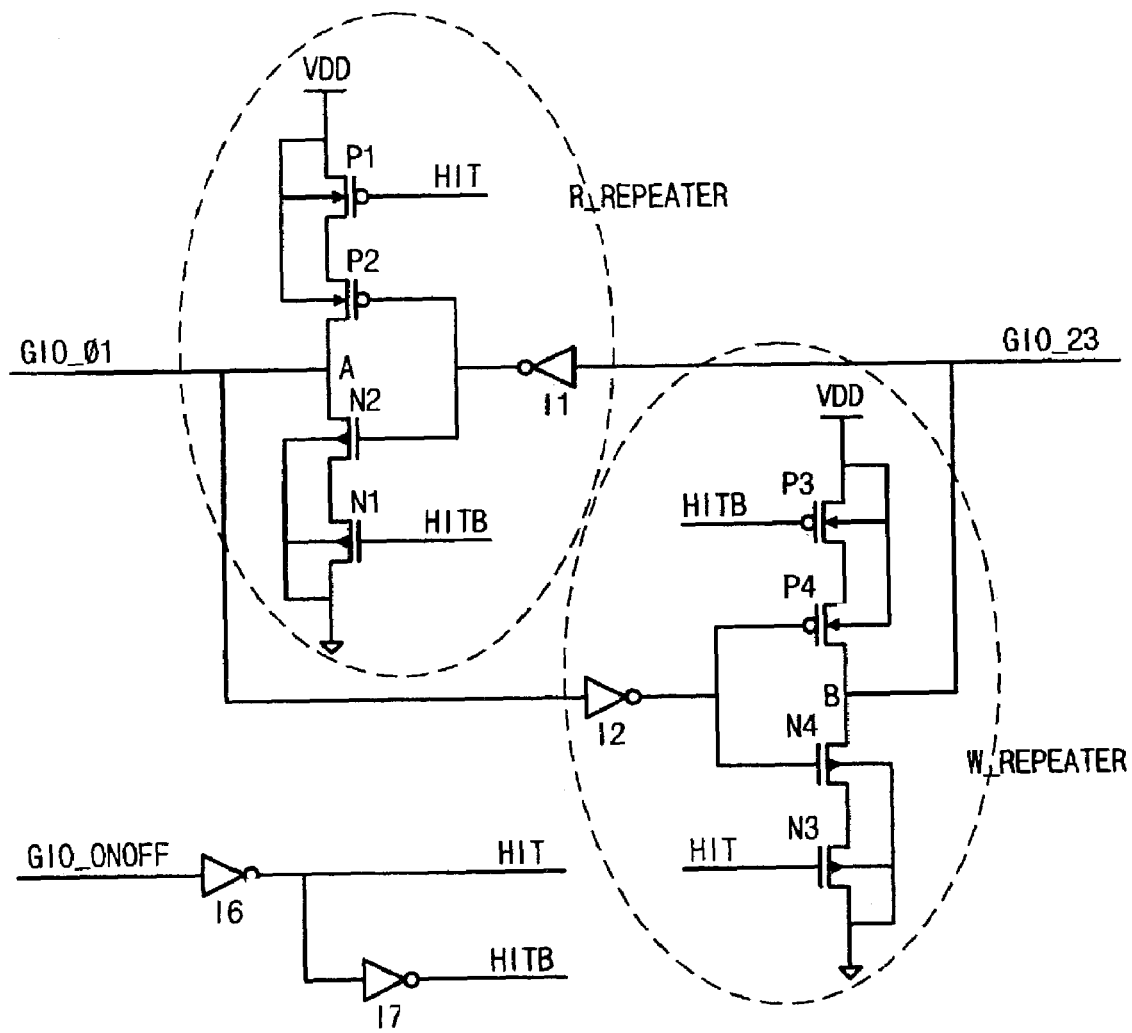
FIG. 3 is an exemplary circuit diagram that depicts a first example of the repeaters.
Figure 4:
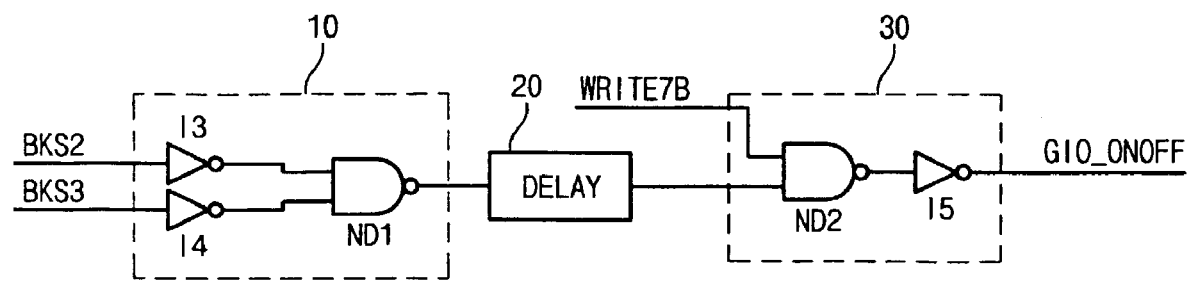
FIG. 4 is an exemplary circuit diagram that depicts a first example of a repeater control unit.

FIGS. 3 and 4 are exemplary circuit diagrams that depict the repeaters R_REPEATER and W_REPEATER, and the repeater control unit GIO_REP_CTRL, respectively. As shown in FIG. 3, the repeater R_REPEATER includes two PMOS transistors P1 and P2 connected in series between a power supply voltage VDD and a node A. The repeater R_REPEATER also includes two NMOS transistors N1 and N2 connected in series between a ground voltage GND and the node A. The inverted signal HIT of the control signal GIO_ONOFF is applied to the gate terminal of the PMOS transistor P1, and the non-inverted signal HITB of the control signal GIO_ONOFF is applied to the gate terminal of the NMOS transistor N1. Gate terminals of the PMOS transistor P2 and the NMOS transistor N2 are commonly connected to the output terminal of an inverter 11. The inverter 11 inverts the signal of the GIO_23 line.

The repeater W_REPEATER includes two PMOS transistors P3 and P4 connected in series between the power supply voltage VDD and a node B. The repeater W_REPEATER also includes two NMOS transistors N3 and N4 connected in series between the ground voltage GND and the node B. The non-inverted signal HITB of the control signal GIO_ONOFF is applied to the gate terminal of the PMOS transistor P3, and the inverted signal HIT of the control signal GIO_ONOFF is applied to the gate terminal of the NMOS transistor N3. Gate terminals of the PMOS transistor P4 and the NMOS transistor N4 are commonly connected to the output terminal of an inverter 12. The inverter 12 inverts the signal of the GIO_01 line.

The repeater control unit GIO_REP_CTRL controls the operation of the repeaters R_REPEATER and W_REPEATER in response to a select signal for the banks BK2 and BK3, and a low level write flag signal WRITE7B during the write operation. The repeater control unit GIO_REP_CTRL generates the control signal GIO_ONOFF having a high level in response to a read command for the banks BK2 and BK3.

As shown in FIG. 4, the repeater control unit GIO_REP_CTRL includes a first logic circuit 10 adapted to receive high level bank select signals BKS2 and BKS3 in response to a read command for the banks BK2 and BK3. The first logic circuit 10 determines whether the IOSA of the bank BK2 or BK3 applied data to the GIO_23 line, and generates an output signal. The repeater control unit GIO_REP_CTRL also includes a delay unit 20 that delays the output signal generated by the first logic circuit 10 for a predetermined time so that a potential of the control signal GIO_ONOFF can be determined before the data is applied to the GIO_23 line. The repeater control unit GIO_REP_CTRL further includes a second logic circuit 30 that receives the output signal from the delay unit 20 and the low level write flag signal WRITE7B. The second logic circuit 30 maintains the control signal GIO_ONOFF in a low level during the write operation, regardless of the output signal generated by the first logic circuit 10.

The control signal GIO_ONOFF generated by the second logic circuit 30 is provided to inverters 16 and 17, which output resultant signals HIT and HITB, respectively. These resultant signals HIT and HITB are provided as inputs to the repeaters R REPEATER and W REPEATER.

The first logic circuit 10 includes inverters 13 and 14 that invert the bank select signals BKS2 and BKS3, respectively. The first logic circuit 10 also includes a logic unit ND1 that receives the two inverted bank select signals BKS2 and BKS3 from the inverters 13 and 14 as inputs. The delay unit 20 may include an inverter chain or a combination of inverters, resistors, and capacitors. The second logic circuit 30 includes a logic unit ND2 that outputs a low level signal when the output signal from the delay unit 20 and the write flag signal WRITE7B are all high. The second logic circuit 30 also includes an inverter 15 that inverts the output signal from the logic unit ND2 to generate the control signal GIO_ONOFF.

The repeater input signal HIT obtained by inverting the control signal GIO_ONOFF by the inverter 16 is applied to the gate terminals of the PMOS transistor P1 and the NMOS transistor N3. Similarly, the repeater input signal HITB obtained by inverting the input signal HIT by the inverter 17 is applied to the gate terminals of the NMOS transistor N1 and the PMOS transistor P3.

Figure 5:
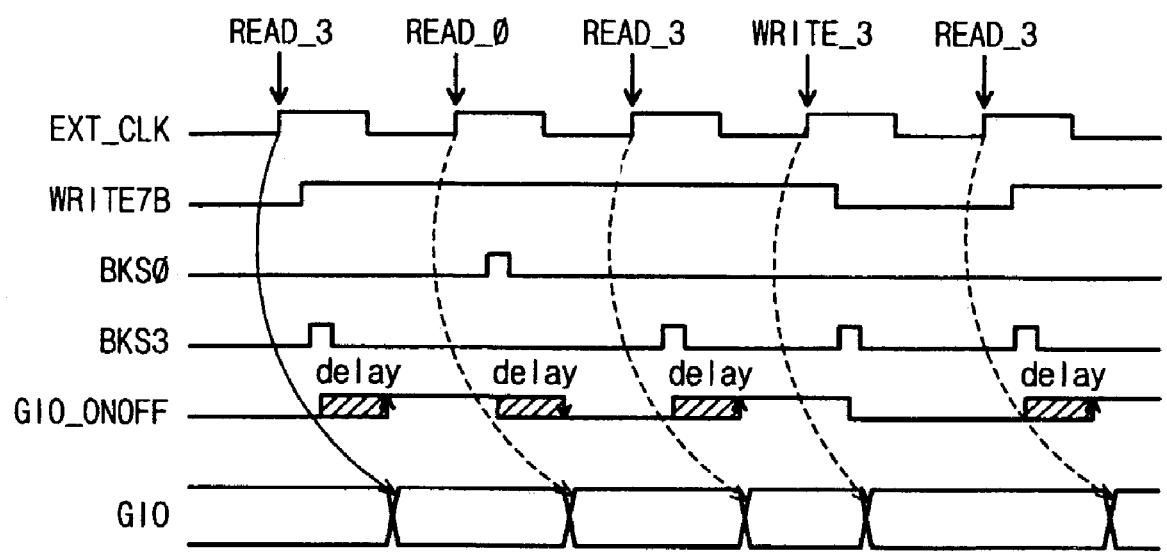
FIG. 5 is a diagram that depicts a timing operation of the semiconductor memory device.

FIG. 5 is a diagram that depicts a timing operation of the semiconductor memory device. As shown in FIG. 5, when a read command READ_3 for the bank BK3 connected to the GIO_23 line is applied according to an external clock EXT_CLK, a high level write flag signal WRITE7B is transmitted to the second logic circuit 30 and a high level select signal BKS3 for the bank BK3 is transmitted to the first logic circuit 10. The first logic circuit 10 outputs a high level output signal. This output signal is delayed in the delay unit 20 for a predetermined time, and then transmitted to the second logic circuit 30. The second logic circuit 30 outputs a high level control signal GIO_ONOFF in response to the high level signal from the delay unit 20 and the high level write flag signal WRITE7B.

The inverters 16 and 17 invert and non-invert, respectively, the high level control signal GIO_ONOFF. In addition, the inverters 16 and 17 transmit the low level repeater input signal HIT and the high level repeater input signal HITB to the repeaters R_REPEATER and W_REPEATER as inputs. In response to the low level repeater input signal HIT and the high level repeater input signal HITB, the PMOS transistor P1 and the NMOS transistor N1 of the repeater R_REPEATER are turned on, while the PMOS transistor P3 and the NMOS transistor N3 of the repeater W_REPEATER are turned off.

During operation of the repeater R_REPEATER, either the power supply voltage VDD or ground voltage GND may be transmitted to the GIO_01 line in response to the data value of the GIO_23 line. The power supply voltage VDD or the ground voltage GND may then be outputted to a desired data pad. Here, the repeater W_REPEATER is not in operation, and thus the data value transmitted to the GIO_01 line is not passed to the GIO_23 line.

Because the line equivalent of half of the GIO line is re-driven through use of the repeaters R_REPEATER and W_REPEATER, values for a resistance R and a capacitor C of the GIO line are reduced in half. Therefore, signal delay is reduced to ¼ (½R×½C) the signal delay of the full GIO line. As such, the slope of the GIO signal is improved. The read operation for the bank BK2 is performed in a similar manner to the read operation for the bank BK3.

When a read command READ_0 for the bank BK0 connected to the GIO_01 line is applied according to the external clock EXT CLK, a high level write flag signal WRITE7B is transmitted to the second logic circuit 30, and low level bank select signals BKS2 and BKS3 are transmitted to the first logic circuit 10. The first logic circuit 10 outputs a low level signal. This signal is delayed in the delay unit 20 for a predetermined time and then transmitted to the second logic circuit 30. The second logic circuit 30 outputs a low level control signal GIO_ONOFF in response to the low level signal from the delay unit 20 and the high level write flag signal WRITE7B.

The inverters 16 and 17 invert and non-invert, respectively, the low level control signal GIO_ONOFF. In addition, the inverters 16 and 17 transmit the high level repeater input signal HIT and the low level repeater input signal HITB to the repeaters R_REPEATER and W_REPEATER as inputs. In response to the high level repeater input signal HIT and the low level repeater input signal HITB, the PMOS transistor P1 and the NMOS transistor N1 of the repeater R_REPEATER are turned off, while the PMOS transistor P3 and the NMOS transistor N3 of the repeater W_REPEATER are turned on.

Because the repeater R_REPEATER is not in operation, the data value of the GIO_23 line is not transmitted to the GIO_01 line. However, the repeater W_REPEATER is in operation so that the data value of the GIO_01 line can be transmitted to the GIO_23 line. The repeater W_REPEATER equalizes the potentials of the GIO_01 line and the GIO_23 line during a read operation for the bank BK0. Accordingly, the two lines GIO_01 and GIO_23 have the same potential.

Because the data amplified by the IOSA is applied on the GIO_01 line, which is half the length of the GIO line, and transmitted to the data pad during a read operation for the bank BK0, the values of the resistor R and the capacitor C become ½ of the values of the resistor R and the capacitor C of the full GIO line. As a result, the delay time is reduced to ¼ of the delay time of the full GIO line, thereby improving the slope of the GIO signal. The read operation for the bank BK1 is performed in a similar manner to the read operation for the bank BK0.

When a write command WRITE_3 for the bank BK3 is applied according to the external clock EXT_CLK, a low level write flag signal WRITE7B is transmitted to the second logic circuit 30, and thus a low level control signal GIO_ONOFF is generated regardless of the respective levels of the bank select signals BKS2 and BKS3.

The operation of the repeaters in response to the low level control signal GIO_ONOFF is similar to the read operation of the banks BK0 and BK1. During a write operation, the data from the data pad are applied to the LIO line via the GIO line. Therefore, the repeater R_REPEATER is not in operation and the repeater W_REPEATER is in operation, regardless of the selection of the banks BK0, BK1, BK2, and BK3. To maintain the control signal GIO_ONOFF at a low level during a write operation, a low level write flag signal WRITE7B is transmitted to the second logic circuit 30. As a result, the slope of the GIO signal transmitted to the bank is also improved during a write operation.

Figure 6:
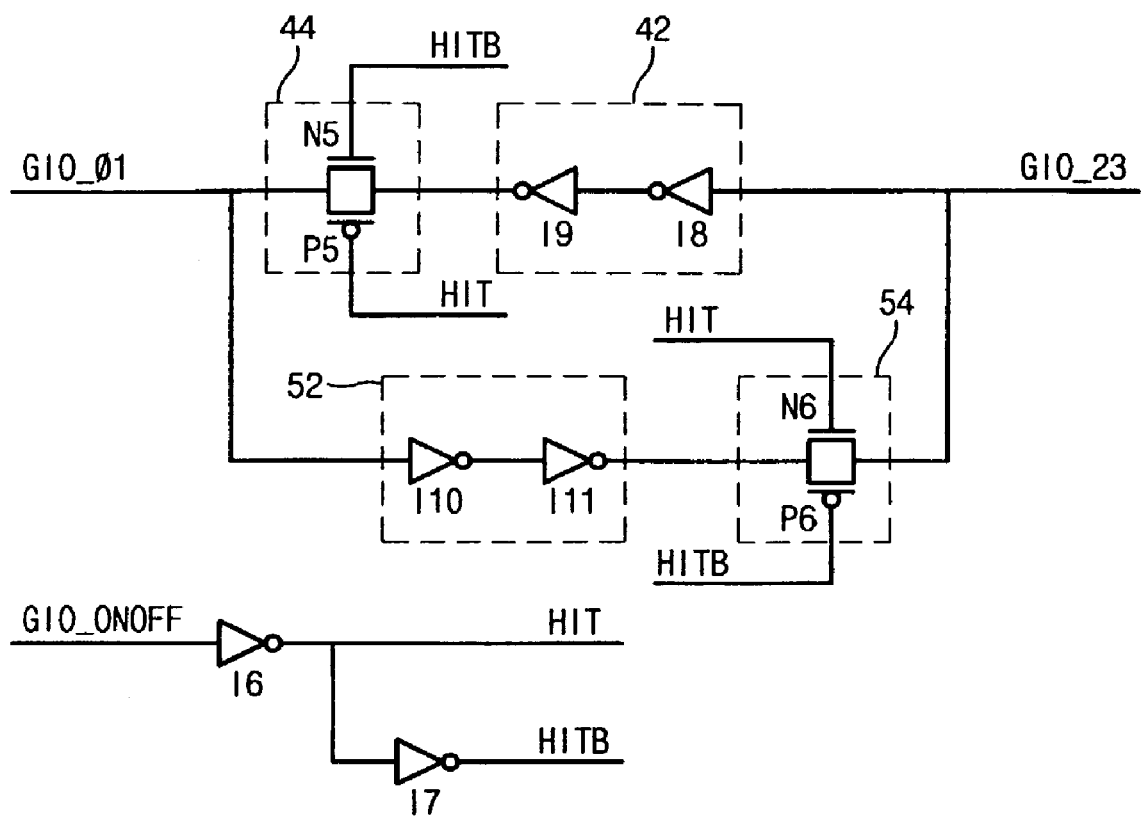
FIG. 6 is an exemplary circuit diagram that depicts a second example of the repeaters.

FIG. 6 is an exemplary circuit diagram that depicts a second example of the repeaters R_REPEATER and W_REPEATER. During a read operation for the banks BK2 and BK3, the repeater R_REPEATER buffers the data of the GIO_23 line and transmits the buffered data to the GIO_01 line in response to the repeater input signals HIT and HITB. The repeater R_REPEATER includes a buffer unit 42 having two inverters 18 and 19 connected in series to the GIO_23 line to buffer and transmit the data of the GIO_23 line. The repeater R_REPEATER also includes a switching unit 44 adapted to be switched on or off in response to the repeater input signals HIT and HITB in order to transmit the buffered GIO_23 signal to the GIO_01 line.

The switching unit 44 includes an NMOS transistor N5 and a PMOS transistor P5 having drain terminals that are commonly connected to the output terminal of the buffer unit 42. In addition, the source terminals of the NMOS transistor N5 and the PMOS transistor P5 are commonly connected to the GIO_01 line. The repeater input signal HITB is applied at the gate terminal of the NMOS transistor N5, and the repeater input signal HIT is applied at the gate terminal of the PMOS transistor P5.

The repeater W_REPEATER buffers the data of the GIO_01 line and transmits the buffered data to the GIO_23 line in response to the repeater input signals HIT and HITB during a write operation for the banks BK0, BK1, BK2, and BK3 or a read operation for banks BK0 and BK1. The repeater W_REPEATER includes a buffer unit 52 having two inverters I10 and I11 connected in series to the GIO_01 line to buffer and transmit the data of the GIO_01 line. The repeater W_REPEATER also includes a switching unit 54 adapted to be switched on or off in response to the repeater input signals HIT and HITB in order to transmit the buffered GIO_01 signal to the GIO_23 line.

The switching unit 54 includes an NMOS transistor N6 and a PMOS transistor P6 having drain terminals that are commonly connected to the output terminal of the buffer unit 52. In addition, the source terminals of the NMOS transistor N6 and the PMOS transistor P6 are commonly connected to the GIO_23 line. The repeater input signal HIT is applied to the gate terminal of the NMOS transistor N6, and the repeater input signal HITB is applied to the gate terminal of the PMOS transistor P6.

Figure 7:
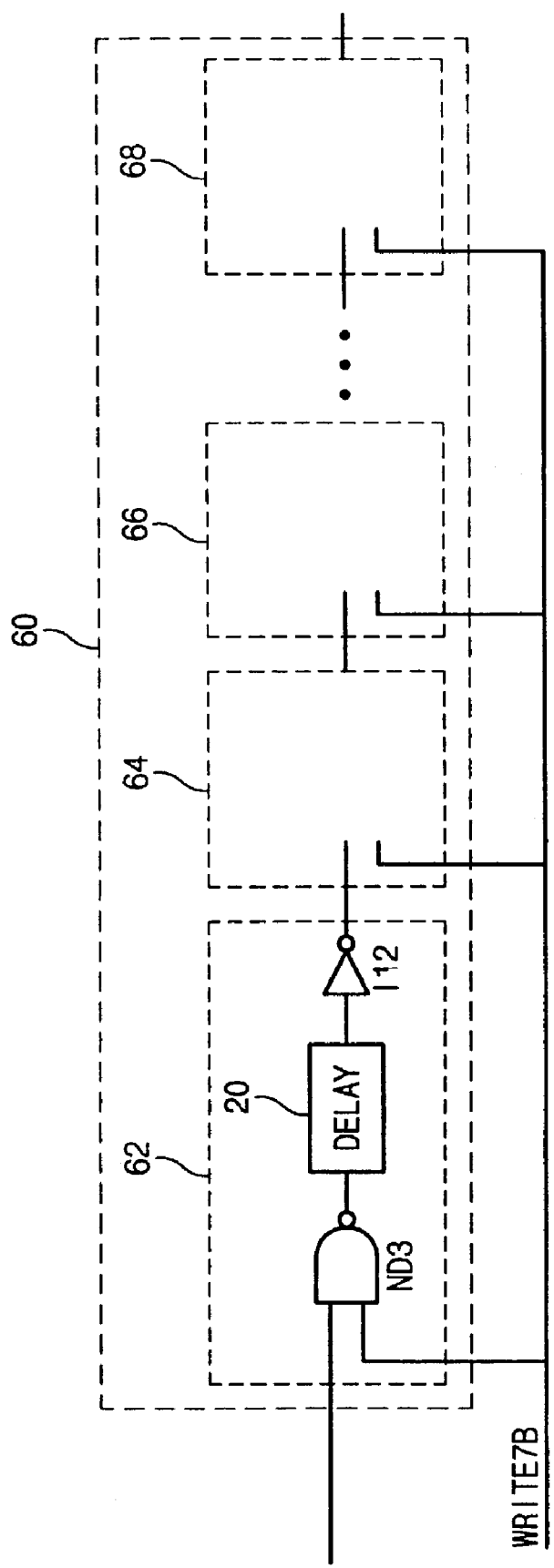
FIG. 7 is an exemplary circuit diagram that depicts a second example of the repeater control unit.

FIG. 7 is an exemplary circuit diagram that depicts a second example of the repeater control unit GIO_REP_CTRL, particularly the delay unit 20 of FIG. 4. As described above, the delay unit 20 may include an inverter chain or a combination of inverters, resistors, and capacitors. Furthermore, the delay unit 20 may store a previous value and output it after a predetermined time. For example, during a write operation, the control signal GIO_ONOFF may be generated at a low level, while during a read operation, the control signal GIO_ONOFF may be generated at a high level for the banks BK2 and BK3. However, to maintain the control signal GIO_ONOFF at a low level when a write operation is changed to a read operation, the delay unit 20 may hold the low level signal previously generated as the control signal GIO_ONOFF, and transmit it to the second logic circuit 30. This is achieved even though the control signal GIO_ONOFF is generated in a high level for the read operation.

In this embodiment, a second delay unit 60 resets the delay unit 20 at a specific time by using the write flag signal WRITE7B outputted at a low level during the write operation. The second delay unit 60 includes a plurality of sub-units 62, 64, 66, and 68. Each of the sub-units 62, 64, 66, and 68 includes a NAND gate ND3 that receives the output signal from the first logic circuit 10 and the write flag signal WRITE7B as inputs. The second delay unit 60 also includes the delay unit 20 that delays the output signal from the NAND gate ND3, as discussed above. The second delay unit 60 further includes an inverter 112, which inverts the output signal from the delay unit 20.

Figure 8:
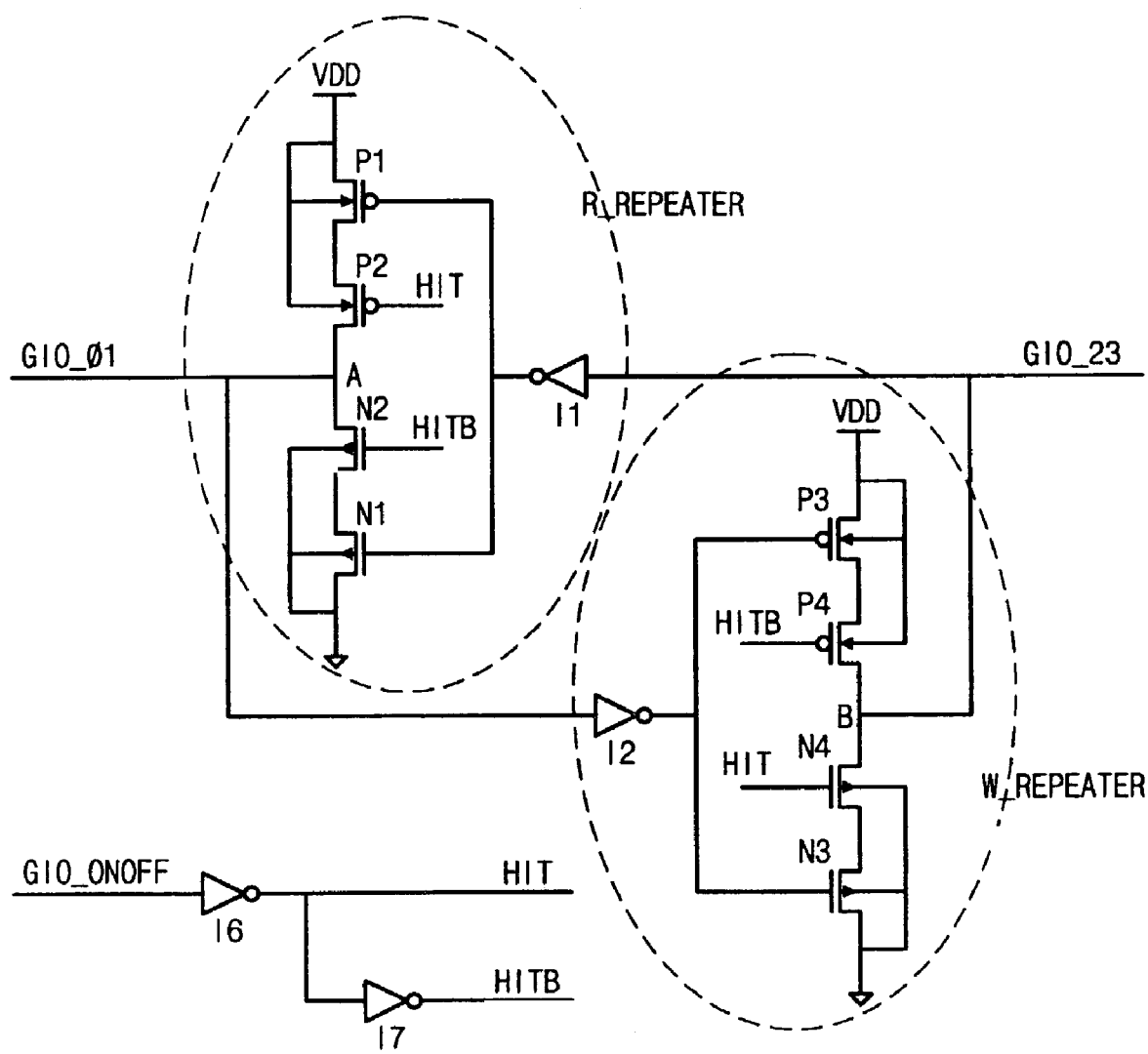
FIG. 8 is an exemplary circuit diagram that depicts a third example of the repeaters.

FIG. 8 is an exemplary circuit diagram that depicts a third example of the repeaters R_REPEATER and W_REPEATER. Unlike the repeaters R_REPEATER and W_REPEATER shown in FIG. 3, the locations of the MOS transistors that receive the inverted signal HIT of the control signal GIO_ONOFF and the non-inverted signal HITB of the control signal GIO_ONOFF, and the MOS transistors that receive the inverted signals of the GIO_01 and GIO_23 lines are changed in the repeaters R_REPEATER and W_REPEATER. More specifically, the gate terminals of the PMOS transistor P1 and the NMOS transistor N1 of the repeater R_REPEATER are commonly connected to the output terminal of the inverter 11, which inverts the signal of the GIO_23 line. Moreover, the inverted signal HIT of the control signal GIO_ONOFF is applied to the gate terminal of the PMOS transistor P2, and the non-inverted signal HITB of the control signal GIO_ONOFF is applied to the gate terminal of the NMOS transistor N2.

In the repeater W_REPEATER, the gate terminals of the PMOS transistor P3 and the NMOS transistor N3 are commonly connected to the output terminal of the inverter 12, which inverts the signal of the GIO_01 line. In addition, the non-inverted signal HITB of the control signal GIO_ONOFF is applied to the gate terminals of the PMOS transistor P4, and the inverted signal HIT of the control signal GIO_ONOFF is applied to the gate terminal of the NMOS transistor N4.

Figure 9:
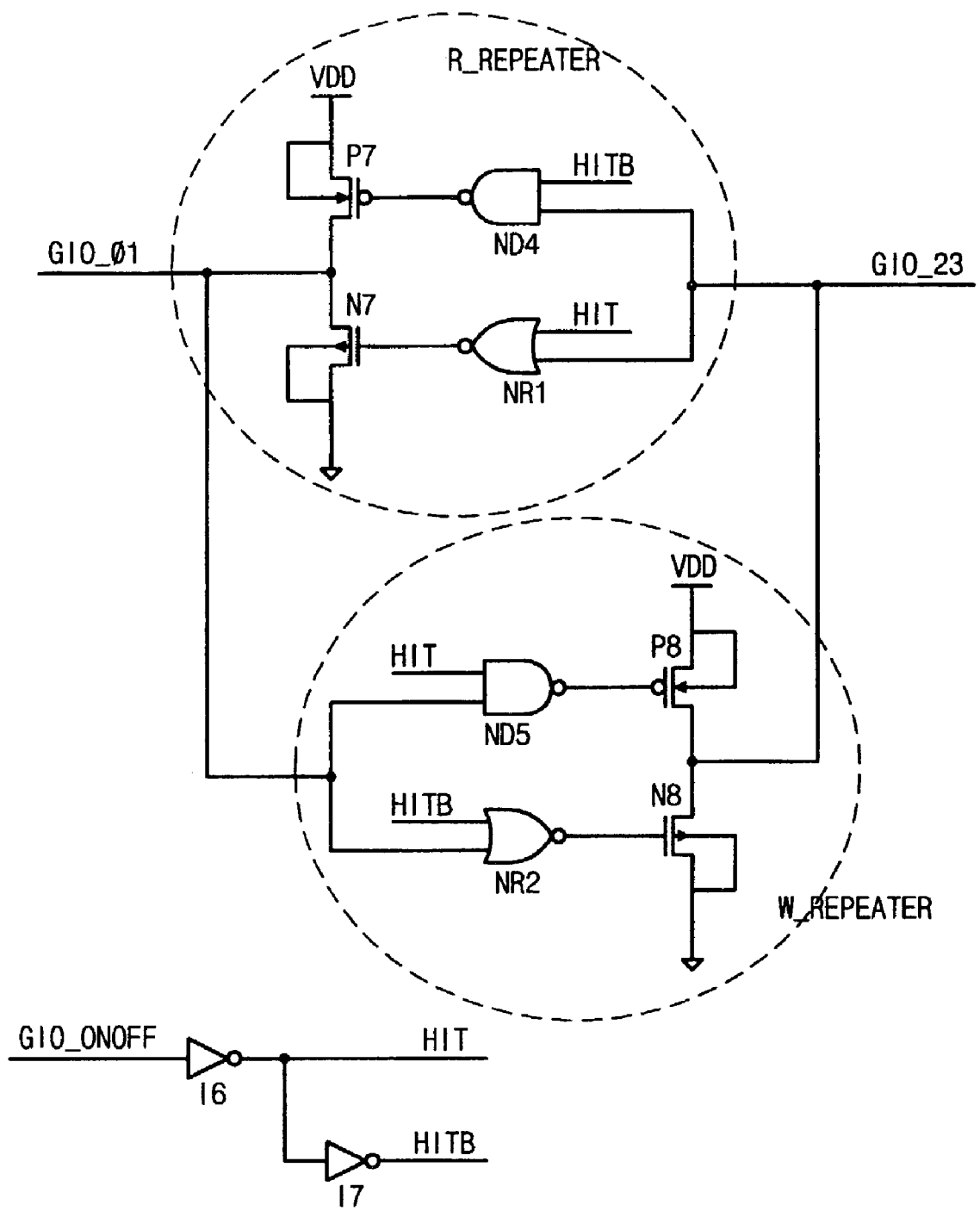
FIG. 9 is an exemplary circuit diagram that depicts a fourth example of the repeaters.

FIG. 9 is an exemplary circuit diagram that depicts a fourth example of the repeaters R_REPEATER and W_REPEATER. In this embodiment, one PMOS transistor and one NMOS transistor are connected in series in both repeaters R_REPEATER and W_REPEATER. More specifically, rather than connecting two PMOS transistors and two NMOS transistors in series between the power supply voltage VDD and the ground voltage GND, a NAND gate and a NOR gate are employed instead. In the repeater R_REPEATER, a PMOS transistor P7 and an NMOS transistor N7 are connected in series between the power supply voltage VDD and the ground voltage GND. The gate terminal of the PMOS transistor P7 is connected to the output terminal of a NAND gate ND4, and the gate terminal of the NMOS transistor N7 is connected to the output terminal of a NOR gate NR1. The NAND gate ND4 receives the signal from the GIO_23 line and the non-inverted signal HITB of the control signal GIO_ONOFF. The NOR gate NRI receives the signal from the GIO_23 line and the inverted signal HIT of the control signal GIO_ONOFF.

In the repeater W_REPEATER, a PMOS transistor P8 and an NMOS transistor N8 are connected in series between the power supply voltage VDD and the ground voltage GND. The gate terminal of the PMOS transistor P8 is connected to the output terminal of a NAND gate ND5, and the gate terminal of the NMOS transistor N8 is connected to the output terminal of a NOR gate NR2. The NAND gate ND5 receives the signal from the GIO_01 line and the inverted signal HIT of the control signal GIO_ONOFF. The NOR gate NR2 receives the signal from the GIO_01 line and the non-inverted signal HITB of the control signal GIO_ONOFF.

As discussed earlier, the semiconductor memory device includes repeaters located at the middle portion of the GIO line that function to buffer the GIO signal during read and write operations for specific banks. This reduces the load of the GIO line, and thereby decreases the delay of the GIO signal and improves the slope of the signal. As a result, the semiconductor memory device is useful during high speed operations.

Many changes and modifications to the embodiments described herein could be made. The scope of some changes is discussed above. The scope of others will become apparent from the appended claims.

What is claimed is:

1. A semiconductor memory device, comprising:
   a repeater located at a global input/output (GIO) line that is shared by a plurality of banks, wherein the repeater buffers and transmits data between a data pad and at least one of the plurality of banks; and
   a repeater control unit adapted to control the repeater in response to a read/write command associated with one of the plurality of banks,
   wherein the GIO line includes a first line unit and a second line unit, wherein the first line unit is located adjacent to the data pad and wherein the second line unit is located farther away from the data pad than the first line unit.

2. The semiconductor memory device according to claim 1, wherein the repeater is located at a center portion of the GIO line.

3. The semiconductor memory device according to claim 1, wherein the repeater includes:
   a first repeater adapted to buffer and transmit data from the second line unit to the first line unit; and
   a second repeater adapted to buffer and transmit data from the first line unit to the second line unit.

4. The semiconductor memory device according to claim 3, wherein the first repeater includes:
   a first buffer unit adapted to buffer and transmit data associated with the second line unit; and
   a first switching unit adapted to be switched between one of an on position and an off position in response to a first control signal generated by the repeater control unit, wherein the first switching unit is further adapted to transmit the data associated with the second line unit from the first buffer unit to the first line unit.

5. The semiconductor memory device according to claim 3, wherein the second repeater includes:
   a second buffer unit adapted to buffer and transmit data associated with the first line unit; and
   a second switching unit adapted to be switched between one of an on position and an off position in response to a first control signal generated by the repeater control unit, wherein the second switching unit is further adapted to transmit the data associated with the first line unit from the second buffer unit to the second line unit.

6. The semiconductor memory device according to claim 3, wherein the first repeater includes:
   a first inverting unit adapted to invert and transmit data associated with the second line unit, and generate a first output signal; and
   a first voltage driving unit adapted to transmit one of a power supply voltage and a ground voltage to the first line unit in response to the first output signal generated by the first inverting unit and a first control signal generated by the repeater control unit.

7. The semiconductor memory device according to claim 3, wherein the second repeater includes:
   a second inverting unit adapted to invert and transmit data associated with the first line unit, and generate a second output signal; and
   a second voltage driving unit adapted to transmit one of a power supply voltage and a ground voltage to the second line unit in response to the second output signal generated by the second inverting unit and a first control signal generated by the repeater control unit.

8. The semiconductor memory device according to claim 3, wherein the first repeater includes:
   a third inverting unit adapted to invert and transmit data associated with the second line unit in response to a first control signal generated by the repeater control unit, wherein the third inverting unit is further adapted to generate a third output signal; and a third voltage driving unit adapted to transmit one of a power supply voltage and a ground voltage to the first line unit in response to the third output signal generated by the third inverting unit.

9. The semiconductor memory device according to claim 3, wherein the second repeater includes:

a fourth inverting unit adapted to invert and transmit data associated with the first line unit in response to a first control signal generated by the repeater control unit, wherein the fourth inverting unit is further adapted to generate a fourth output signal; and a fourth voltage driving unit adapted to transmit one of a power supply voltage and a ground voltage to the second line unit in response to the fourth output signal generated by the fourth inverting unit.

10. The semiconductor memory device according to claim 3, wherein the repeater control unit is adapted to operate one of the first repeater and the second repeater.

11. The semiconductor memory device according to claim 10, wherein the repeater control unit is adapted to drive the first repeater in response to a read command associated with banks that are connected to the second Line unit.

12. The semiconductor memory device according to claim 10, wherein the repeater control unit is adapted to drive the second repeater in response to one of a read command and a write command associated with banks that are connected to the first line unit.

13. The semiconductor memory device according to claim 1, wherein the repeater control unit includes:

a first logic circuit that determines whether data associated with banks that are connected to the second line unit are applied to the second line unit, and generates a fifth output signal;

a delay unit that delays the fifth output signal generated by the first logic circuit for a predetermined time; and a second logic circuit that generates a second control signal to control the operation of the repeater in response to the fifth output signal generated by the delay unit and a flag signal generated during a write operation.

14. The semiconductor memory device according to claim 13, wherein the delay unit includes an inverter chain.

15. The semiconductor memory device according to claim 13, wherein the delay unit includes a combination of inverters, resistors, and capacitors.

16. The semiconductor memory device according to claim 13, wherein the delay unit includes a plurality of sub-units, and wherein the plurality of sub-units is reset in response to the flag signal.

17. The semiconductor memory device according to claim 13, wherein the second logic circuit controls the second repeater in response to the flag signal, regardless of the fifth output signal generated by the delay unit.

* * * * *

UNITED STATES PATENT AND TRADEMARK OFFICE
CERTIFICATE OF CORRECTION

PATENT NO. : 7,206,213 B2 Page 1 of 1
APPLICATION NO. : 10/329631
DATED : April 17, 2007
INVENTOR(S) : Mi Y. Kim It is certified that error appears in the above-identified patent and that said Letters Patent is hereby corrected as shown below:

In the Claims:

At Column 9, line 22, "Line" should be -- line --.

Signed and Sealed this

Sixth Day of November, 2007

JON W. DUDAS
*Director of the United States Patent and Trademark Office*